United States Patent
Chen et al.

(10) Patent No.: US 7,335,956 B2
(45) Date of Patent: Feb. 26, 2008

(54) CAPACITOR DEVICE WITH VERTICALLY ARRANGED CAPACITOR REGIONS OF VARIOUS KINDS

(75) Inventors: Yueh-You Chen, Hsin-Chu (TW); Chung-Long Chang, Dou-Liu (TW); Chih-Ping Chao, Chu-Dong Town (TW); Chun-Hong Chen, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 225 days.

(21) Appl. No.: 11/055,933

(22) Filed: Feb. 11, 2005

(65) Prior Publication Data

US 2006/0180895 A1 Aug. 17, 2006

(51) Int. Cl.
  *H01L 29/76* (2006.01)
  *H01L 23/495* (2006.01)
(52) U.S. Cl. .............. 257/386; 257/390; 257/545; 257/595; 257/691; 257/E29.344
(58) Field of Classification Search .............. 257/386, 257/390, 545, 595, 691, E29.344
See application file for complete search history.

(56) References Cited

U.S. PATENT DOCUMENTS

| | | | |
|---|---|---|---|
| 6,645,810 B2 | 11/2003 | Ng et al. | |
| 6,656,850 B2 | 12/2003 | Molloy et al. | |
| 6,667,506 B1 | 12/2003 | Reedy et al. | |
| 6,686,640 B2 | 2/2004 | Mheen et al. | |
| 6,720,608 B2 | 4/2004 | Lee | |
| 2002/0024087 A1* | 2/2002 | Aton | 257/313 |
| 2004/0080038 A1* | 4/2004 | Chew et al. | 257/691 |
| 2004/0232497 A1* | 11/2004 | Akiyama et al. | 257/390 |
| 2005/0017324 A1* | 1/2005 | Yamamoto | 257/532 |
| 2005/0225350 A1* | 10/2005 | Toshiyuki et al. | 324/769 |

* cited by examiner

*Primary Examiner*—Thanh Van Pham
(74) *Attorney, Agent, or Firm*—Duane Morris LLP

(57) ABSTRACT

A capacitor device selectively combines MOM, MIM and varactor regions in the same layout area of an IC. Two or more types of capacitor regions arranged vertically on a substrate to form the capacitor device. This increase the capacitance per unit of the capacitor device, without occupying an extra layout area.

22 Claims, 2 Drawing Sheets

CAPACITOR DEVICE WITH VERTICALLY ARRANGED CAPACITOR REGIONS OF VARIOUS KINDS

BACKGROUND

The present invention relates generally to integrated circuit (IC) designs, and more particularly to a capacitor device with a metal-insulator-metal (MIM) capacitor region, metal-oxide-metal (MOM) capacitor region, or varactor region vertically arranged on the same layout area.

The construction of passive electronic circuit elements, such as capacitors, on an IC can be tedious, time consuming, and costly. It is therefore important to assemble such IC elements using the processes, materials, and designs that are relevant to the technology and that are already in production.

Capacitors occur naturally, whether intended, or not. Such capacitors can be useful. Active IC elements, such as bipolar and metal-oxide-semiconductor (MOS) transistors, and some resistors contain electrical junctions with capacitance. A depletion region of an electrical junction is, by nature, a small parallel plate capacitor. That capacitor can be used as a fixed-value capacitor, or it can be used as a variable capacitor, since its value changes as the voltage applied to the junction changes. Passive IC elements, such as polycrystalline silicon (polysilicon) and metal lines, have inherent capacitance, with respect to each other and to any other conductors.

The effort of a designer can be to use available characteristics of IC elements. The difficulty with such effort is that the resulting structures exhibit capacitance values only on the order of femtofarads/micron squared. Achieving functional capacitance values in an IC element requires structures that typically are much larger than the active elements, especially when used in mixed signal and/or radio frequency (RF) circuits. This imbalance is uneconomical, since it forces the circuit designer to dedicated space for capacitors and produce IC chips that are too large. The designer can choose among several structural types of capacitors, but no one type offers a convenient balance of performance and space economy.

In one example, the voltage-variable capacitance of an electrical junction can be applied in the construction of a variable capacitor, or a varactor. In another example, the dual-damascene techniques typically used with copper multilevel interconnection metallization on ICs can be used to construct stacks of copper-filled vias and trenches. Two or more such copper-filled vias or trenches, separated by oxide dielectrics, form a capacitor, which is called a MOM capacitor. This MOM capacitor requires a complex design, but the form is efficient and the process steps required are usually already involved in the a standard semiconductor device fabrication process. In yet another example, simple horizontal parallel plates of metal, separated by dielectrics, form a capacitor, which is called a MIM capacitor. The horizontal form of this MIM capacitor occupies relatively more lateral layout space, but is simple to construct.

Since a single type of capacitor does not always provide sufficient capacitance per unit, it is desirable in the art of integrated circuit designs that additional devices are provided to combine various types of capacitors in the same layout area for increasing the capacitance per unit of the same.

SUMMARY

In view of the foregoing, the following provides a capacitor device selectively combining MOM, MIM and varactor regions in the same layout area of an IC. In one embodiment of the present invention, two or more types of capacitor regions are arranged vertically on a substrate to form a capacitor device. This increase the capacitance per unit of the capacitor device, without occupying an extra layout area.

The construction and method of operation of the invention, however, together with additional objects and advantages thereof will be best understood from the following description of specific embodiments when read in connection with the accompanying drawings.

DESCRIPTION

The following will provide a detailed description of a capacitor device selectively combining MIM, MOM and varactor regions in the same layout area of an IC. It is understood that different capacitor regions can be used in advantageous combinations in mixed signal and/or radio frequency (RF) circuits.

Several capacitor structures are in use in ICs. Each one has a characteristic capacitance value per square micron ($\mu$). A typical MIM capacitor offers about 0.5 femtofarad/$\mu^2$ (fF/$\mu^2$). A typical MOM capacitor offers about 0.15 fF/$\mu^2$ per layer. A variable capacitor, or a varactor, offers about 1 to 6 fF/$\mu^2$. Different capacitor structures can be used in combinations in mixed signal and/or RF circuits. This invention provides a capacitor device that includes two or more different types of capacitors, such as MIM capacitors, MOM capacitors and varactors, in a vertical arrangement in the same layout area. This increases the capacitance value per unit without occupying layout areas more than a conventional MIM capacitor, MOM capacitor or varactor would do.

Figure 1:
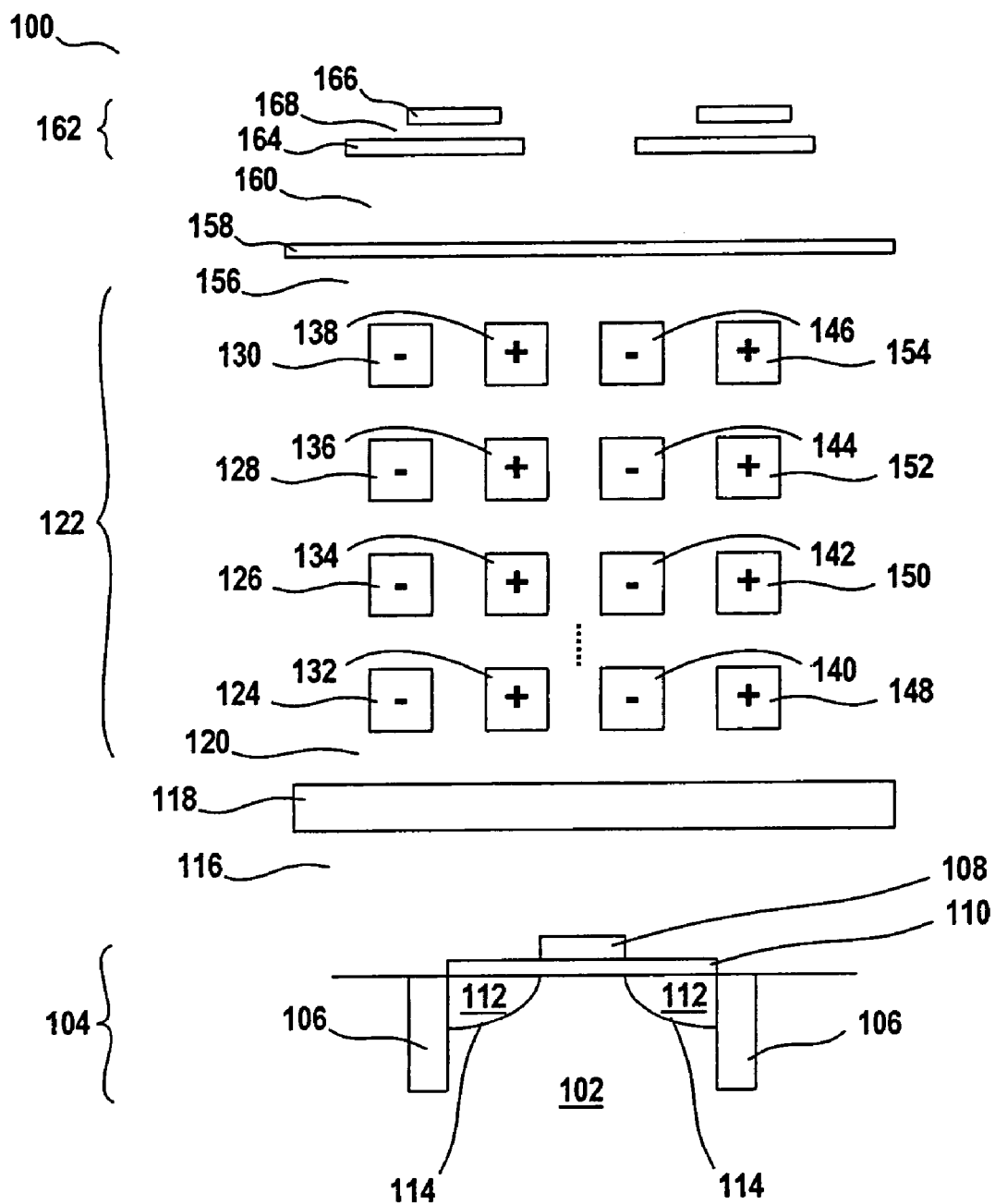
FIG. 1 illustrates a capacitor device, in accordance with one embodiment of the present invention.

FIG. 1 illustrates a capacitor device 100 in accordance with one embodiment of the present invention. As will be evident, the capacitor device 100 comprises three capacitor regions, all of which are understood to be constructed in the same layout area of an IC. It is noteworthy that while, in this embodiment, the capacitor device 100 includes three capacitor regions, only two are able to increase the capacitance per unit, according to the present invention. For example, a combination of the capacitor regions can be varactor and MOM capacitor regions, MOM and MIM capacitor regions, or MIM and varactor capacitor regions.

The three capacitor regions are aligned in the same layout area, e.g., a first region, of the IC. FIG. 1 shows that the three capacitor regions are not coupled by a vertical conductive component in the illustrated layout area but, instead, are separated by metal shielding layers 118 and 158.

A semiconductor P-type substrate 102 is a host to a varactor region 104 having at least one varactor. An active area is enclosed by isolation structures 106, such as a shallow trench isolation (STI) or local oxidation of silicon.

A MOS gate 108 is deposited on a MOS gate dielectric layer 110. The gate 108 may be made of poly-silicon or metal, including, but not limited to, W, Al, AlCu, Cu, Ti, TiSi$_2$, Co, CoSi$_2$, Ni, NiSi, TiN, TiW, or TaN. The gate dielectric layer 110 may be made of a material including, but not limited to, Si$_3$N$_4$, nitrided oxide, Hf oxide, Al$_2$O$_5$, Ta$_2$O$_5$, metal oxide. Two N+ regions 112, as a diffused source and drain, are disposed in the substrate 102, underneath the MOS gate 108 and between the isolation structures 106. Electrical junctions 114, between the N+ regions 112 and the P-type substrate 102, have capacitance relative to the MOS gate 108. As the bias on the electrical junctions 114 and the bias on the MOS gate 108 change, the width and area of the depletion region under the MOS gate 108 also changes, thereby further changing the capacitance of the varactor region 104. It is note worthy that the above-described MOS capacitor is only one exemplary varactor for the varactor region 104. Other types of varactors, such as a junction capacitor or bipolar junction transistor capacitor, can also be as a varactor for the varactor region 104.

Above the varactor region 104 is a dielectric layer 116, which may be made of a material including, but not limited to, oxide, silicon oxynitride, silicon nitride, tantalum oxide, alumina, hafnium oxide, plasma enhanced chemical vapor deposition (PECVD) oxide, tetraethylorthosilicate (TEOS). Above the dielectric layer 116 is a metal shielding layer 118 that acts as a shield to separate any capacitor structure thereabove from being influenced by the capacitance of the varactor region 104 or any other semiconductor structure therebelow. The metal shielding layer 118 may be made of a material including, but not limited to, poly, polyside, AlCu, Al, Cu, Ag, and Au. Above the metal shielding layer 118 is a dielectric layer 120, which can be made from the same candidate materials as those of the dielectric layer 116.

A MOM capacitor region 122 is disposed above the metal shielding layer 118 and the dielectric layer 120. The rectangles shown in FIG. 1 are actually cross sections of dielectric-separated horizontal bars 124, 126, 128, and 130 that run perpendicular to the page and parallel to the substrate 102. The same is true for dielectric-separated horizontal bars 132, 134, 136, 138, 140, 142, 144, 146, 148, 150, 152 and 154. Each of these bars is formed as metal that fills a trench in a typical multi-level metal structure. These horizontal bars may be made of a material including, but not limited to, W, Al, AlCu, Cu, Ti, TiSi$_2$, Co, CoSi$_2$, Ni, NiSi, TiN, TiW, or TaN. It is understood that while the MOM capacitor region is shown to include 16 of such horizontal bars arranged in a 4×4 fashion, other configurations with other arrangements are contemplated. These isolated bars are close enough together in an array to offer useable capacitance. As an example, a collection of them can offer a significant capacitance value. One advantage by arranging the bars to form a vertical column of horizontal bars is to achieve capacitance while occupying less lateral space. The horizontal bars in each vertical column have either a positive or a negative charge. Therefore, each column of horizontal bars forms a porous or slatted vertical capacitor plate. The dielectric that intervenes between that slatted plate and the next one acts as a capacitor dielectric. For instance, the horizontal bars 124, 126, 128 and 130 form a negatively charged slatted first vertical capacitor plate, while the horizontal bars 132, 134, 136 and 138 form a positively charged slatted second vertical capacitor plate.

Above the MOM capacitor region 122 is a dielectric layer 156, which may be made from the same candidate materials as the dielectric layer 120 or 116. Above the dielectric layer 156 is a metal shielding layer 158 that acts as a shield to separate any capacitor structure thereabove from the capacitance of the MOM capacitor region 122 or any other semiconductor structures therebelow. The metal shielding layer 158 may be made of a material including, but not limited to, Cu, AlCu, Ag, and Au. Above the metal shielding layer 158 is a dielectric layer 160, which may be made from the same candidate materials as the dielectric layer 120, 116 or 156. Above the metal shielding layer 158 and the dielectric layer 160 is a MIM capacitor region 162. The MIM capacitor region 162 having one or more MIM capacitors is constructed of simple horizontal flat patterned metal plates 164 and 166 separated by a dielectric layer 168. The metal plates 164 and 166 may be made of a material including, but not limited to, W, Al, AlCu, Cu, Ti, TiSi$_2$, Co, CoSi$_2$, Ni, NiSi, TiN, TiW, or TaN. The combination of the metal plate 166, the metal plate 164, and the dielectric layer 168 in between forms a parallel plate capacitor, to be further seen as one MIM capacitor.

The combinations of capacitor types listed above offer greater capacitance per unit surface area, and therefore, lower cost, than is achievable with only one type of capacitors. Combinations of capacitor types also allow greater design flexibility for the designer. It is noteworthy that the vertically sacked capacitor regions can be arranged in an order other than that described above. For example, the MOM region 122 and the MIM region 162 may be switched, without departing the spirit of the invention.

Figure 2:
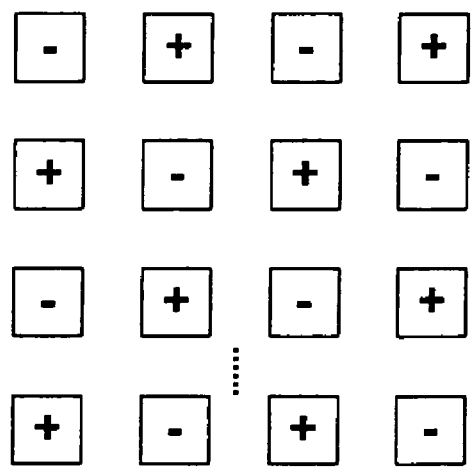
FIG. 2 illustrates an alternative MOM capacitor region of the capacitor device, in accordance with the embodiment of the invention.

FIG. 2 illustrates an alternative MOM capacitor region 200, in accordance with one embodiment of the invention. The alternative MOM capacitor 200 is similar to the MOM capacitor region 122, as shown in FIG. 1, except that the alternative MOM capacitor 200 is charged in a different pattern. Specifically, in the alternative MOM capacitor region 200, the positive and negative charges on individual bars are assigned in a checkerboard pattern. In other words, the charge of all oxide-separated horizontal bars immediately adjacent to each oxide-separated horizontal bar in question is opposite to the charge of that oxide-separated horizontal bar in question. The total capacitance achievable in the alternative MOM capacitor region 200, when compared with the MOM capacitor region 122, is slightly different.

Figure 3:
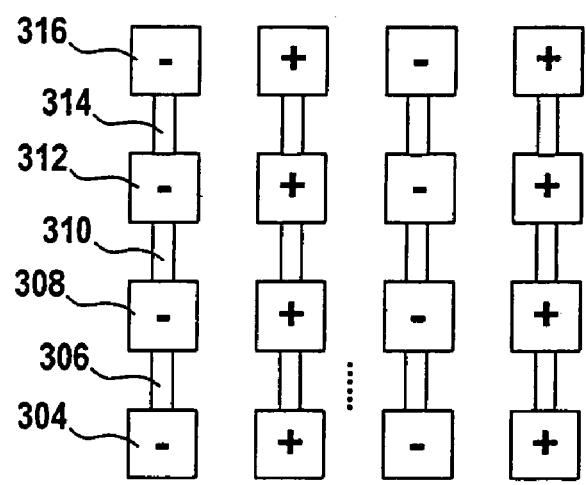
FIG. 3 illustrates another alternative MOM capacitor region of the capacitor device, in accordance with the embodiment of the invention.

FIG. 3 illustrates another alternative MOM capacitor region 300, in accordance with one embodiment of the invention. The MOM capacitor region 300 is similar to the MOM capacitor region 122, as shown in FIG. 1, except that each column of dielectric-separated horizontal bars are connected vertically by vias, filled with a conductive material. For instance, a horizontal bar 304 is connected by a via 306 to a horizontal bar 308. The horizontal bar 308 is also connected by a via 310 to a horizontal bar 312. The horizontal bar 312 is also connected by a via 314 to a horizontal bar 316. It is understood that the charging patterns of the horizontal bars in the MOM capacitor region 300 are similar to the charging patterns of the MOM capacitor region 122, because horizontal bars connected vertically by one or more vias must have the same charging pattern. In addition, it is understood that since vias are typically deployed in a multiple fashion, each vertical capacitor plate is now denser, thereby increasing capacitance. In addition, it is understood that the vias add to the surface area of each vertical capacitor plate, thereby further increasing capacitance.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A capacitor device comprising:
   a varactor region formed on a first region of a substrate;
   a metal-oxide-metal (MOM) capacitor region formed over the varactor region, the MOM capacitor region comprising a plurality of discrete conductive bars disposed in a plurality of layers in the first region, each conductive bar electrically isolated from other of the discrete conductive bars by dielectric;
   a metal-isolator-metal (MIM) capacitor region formed on top of the MOM capacitor region,
   wherein the varactor, MOM, and MIM regions are vertically aligned within the first region to provide an enhanced unit capacitance and are not vertically coupled by a conductive component within the first region.

2. The capacitor device of claim 1 wherein the varactor region includes a MOS capacitor, junction capacitor or bipolar junction transistor capacitor.

3. The capacitor device of claim 1 further comprising a first metal shielding layer for shielding the varactor region from the MOM capacitor region.

4. The capacitor device of claim 1 further comprising a second metal shielding layer for shielding the MOM capacitor region from the MIM capacitor region.

5. The capacitor device of claim 1 wherein the MIM capacitor region provides a unit capacitance of at least 0.5 $fF/\mu m^2$.

6. The capacitor device of claim 1 wherein the varactor region provides a unit capacitance of at least 1 $fF/\mu m^2$.

7. The capacitor device of claim 1 wherein the discrete conductive bars of the same type of charge are arranged in the same column.

8. The capacitor device of claim 1 wherein the discrete conductive bars of different types of charge are arranged in a checkerboard manner.

9. The capacitor device of claim 1 wherein the MOM region provides a unit capacitance per metal layer of at least 0.15 $fF/\mu m^2$ per layer.

10. A capacitor device having a plurality of capacitor regions aligned vertically on a first region of a substrate to provide an enhanced unit capacitance and sharing no common conductive components vertically coupling the plurality of capacitor regions in the first region, wherein the plurality of capacitor regions include at least a varactor region, a metal-oxide-metal (MOM) capacitor region, and a metal-isolator-metal (MIM) capacitor region, the MOM capacitor region comprising a plurality of discrete conductive bars disposed in a plurality of layers in the first region, each discrete conductive bar electrically isolated from other of the discrete conductive bars by dielectric.

11. The capacitor device of claim 10 wherein the varactor region includes a MOS capacitor, junction capacitor or bipolar junction transistor capacitor.

12. The capacitor device of claim 10 further comprising a metal shielding layer for shielding one region from another.

13. The capacitor device of claim 10 wherein the MIM capacitor region provides a unit capacitance of at least 0.5 $fF/\mu m^2$.

14. The capacitor device of claim 10 wherein the varactor region provides a unit capacitance of at least 1 $fF/\mu m^2$.

15. The capacitor device of claim 10 wherein the discrete conductive bars of the same type of charge are arranged in the same column.

16. The capacitor device of claim 10 wherein the discrete conductive bars of different types of charge are arranged in a checkerboard manner.

17. The capacitor device of claim 10 wherein the MOM region provides a unit capacitance per metal layer of at least 0.15 $fF/\mu m^2$ per layer.

18. A capacitor device having more than two types of capacitor regions aligned vertically in a first region of a substrate, sharing no common conductive components vertically coupling the plurality of capacitor regions in the first region and for using with radio frequency circuits, the device comprising:
    a varactor region formed on a substrate providing at least a unit capacitance of at least 1 $fF/\mu m^2$; and
    at least a metal-oxide-metal (MOM) capacitor region providing a unit capacitance per metal layer of at least 0.15 $fF/\mu m^2$ per layer formed over the varactor region to provide an enhanced unit capacitance,
    the MOM capacitor region comprising a plurality of discrete conductive bars disposed in a plurality of layers in the first region, each discrete conductive bar electrically isolated from other of the discrete conductive bars by dielectric.

19. The capacitor device of claim 18 wherein the varactor region includes a MOS capacitor, junction capacitor or bipolar junction transistor capacitor.

20. The capacitor device of claim 18 further comprising a metal shielding layer for shielding one region from another.

21. The capacitor device of claim 18 further comprising a metal-isolator-metal (MIM) capacitor region providing at least a unit capacitance of at least 0.5 $fF/\mu m^2$ vertically aligned over the veractor region.

22. The capacitor device of claim 21 wherein both the MOM and MIM capacitor regions are arranged one after another vertically over the varactor region.

* * * * *